United States Patent
Kim

(10) Patent No.: US 9,804,914 B2
(45) Date of Patent: Oct. 31, 2017

(54) SEMICONDUCTOR MEMORY AND SEMICONDUCTOR SYSTEM USING THE SAME

(71) Applicant: SK hynix Inc., Incheon-si Gyeonggi-do (KR)

(72) Inventor: Min Jeong Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 70 days.

(21) Appl. No.: 15/048,200

(22) Filed: Feb. 19, 2016

(65) Prior Publication Data

US 2017/0084311 A1 Mar. 23, 2017

(30) Foreign Application Priority Data

Sep. 18, 2015 (KR) ........................ 10-2015-0132622

(51) Int. Cl.
| | |
|---|---|
| *G06F 11/00* | (2006.01) |
| *G06F 11/07* | (2006.01) |
| *G11C 29/02* | (2006.01) |
| *G11C 29/26* | (2006.01) |
| *G11C 29/42* | (2006.01) |
| *G11C 29/44* | (2006.01) |
| *G11C 5/14* | (2006.01) |

(52) U.S. Cl.
CPC .......... *G06F 11/079* (2013.01); *G06F 11/073* (2013.01); *G06F 11/0751* (2013.01); *G11C 29/025* (2013.01); *G11C 29/26* (2013.01); *G11C 29/42* (2013.01); *G11C 29/4401* (2013.01); *G11C 5/14* (2013.01)

(58) Field of Classification Search
USPC ........................................... 714/49
See application file for complete search history.

(56) References Cited

U.S. PATENT DOCUMENTS

| | | | |
|---|---|---|---|
| 8,495,468 B2 | 7/2013 | Dachiku | |
| 2005/0044451 A1* | 2/2005 | Fry | G06F 11/3485 714/38.1 |
| 2007/0006048 A1* | 1/2007 | Zimmer | G06F 11/008 714/42 |
| 2007/0055914 A1* | 3/2007 | Chandwani | G06F 11/008 714/47.2 |
| 2014/0032980 A1* | 1/2014 | Kulkarni | G06F 11/1008 714/48 |

* cited by examiner

*Primary Examiner* — Sarai Butler
(74) *Attorney, Agent, or Firm* — William Park & Associates Ltd.

(57) ABSTRACT

A semiconductor memory includes a plurality of path circuits for transmitting data inputted from an exterior source or device to a chip. The semiconductor memory is configured to generate a plurality of pre-error detection signals by detecting whether data transmitted between the plurality of path circuits have errors, and selectively output the plurality of pre-error detection signals.

20 Claims, 5 Drawing Sheets

SEMICONDUCTOR MEMORY AND SEMICONDUCTOR SYSTEM USING THE SAME

CROSS-REFERENCES TO RELATED APPLICATION

The present application claims priority under 35 U.S.C. §119(a) to Korean application number 10-2015-0132622, filed on Sep. 18, 2015, in the Korean Intellectual Property Office, which is incorporated herein by reference in its entirety.

BACKGROUND

1. Technical Field

Various embodiments generally relate to a semiconductor circuit, and, more particularly, to a semiconductor memory and a semiconductor system.

2. Related Art

As a way of increasing a degree of integration, a semiconductor memory may have a three-dimensional structure in which a plurality of chips are stacked.

Such a semiconductor memory having a three-dimensional structure may use through vias to transmit and receive signals of the plurality of chips.

Any one of the plurality of chips may transmit data inputted from an external device, to other chips through a plurality of path circuits.

Since the data transmitted to other chips may vary to a value different from an original value during a transmission process thereof and may thereby cause an error, it is necessary to test the data.

SUMMARY

In an embodiment, a semiconductor memory may include a plurality of path circuits for transmitting data inputted from an exterior source or device to a chip. Further, the semiconductor memory may be configured to generate a plurality of pre-error detection signals by detecting whether data transmitted between the plurality of path circuits have errors, and selectively output the plurality of pre-error detection signals.

In an embodiment, a semiconductor memory may include a plurality of chips stacked such that signals are transmitted and received through through electrodes. Further, any one of the plurality of chips comprises a plurality of path circuits for transmitting external data to the other chips through the through electrodes. In addition, the semiconductor memory is configured to generate a plurality of pre-error detection signals by detecting whether data transmitted between the plurality of path circuits have errors, and selectively output the plurality of pre-error detection signals.

In an embodiment, a semiconductor memory may include a physical layer and a through electrode electrically coupled such that external data and a parity bit corresponding to the external data sequentially pass therethrough. The semiconductor memory may also include a first error detection circuit configured to detect a first pre-error detection signal by using the external data and the parity bit. The semiconductor memory may also include a second error detection circuit configured to detect a second pre-error detection signal by using the external data and the parity bit passing through the through electrode and a memory block. The semiconductor memory may also include a multiplexer configured to output an error detection signal by selecting one of the first pre-error detection signal and the second pre-error detection signal according to a control signal.

In an embodiment, a semiconductor system may include a semiconductor memory configured to output an error detection signal generated by detecting whether data transmitted between a plurality of path circuits for any one chip among a plurality of chips to transmit external data to the other chips through through electrodes has an error. The semiconductor system may also include a processor configured to provide the external data to the semiconductor memory, and determine whether a data transmission error has occurred according to the error detection signal. The semiconductor system may also include a substrate configured to provide signal paths for communication between the processor and the semiconductor memory.

DETAILED DESCRIPTION

Hereinafter, a semiconductor memory and a semiconductor system using the same will be described below with reference to the accompanying figures through various embodiments. Various embodiments are directed to a semiconductor memory capable of detecting a position where an error has occurred during a data transmission process, and a semiconductor system using the same.

Figure 1:
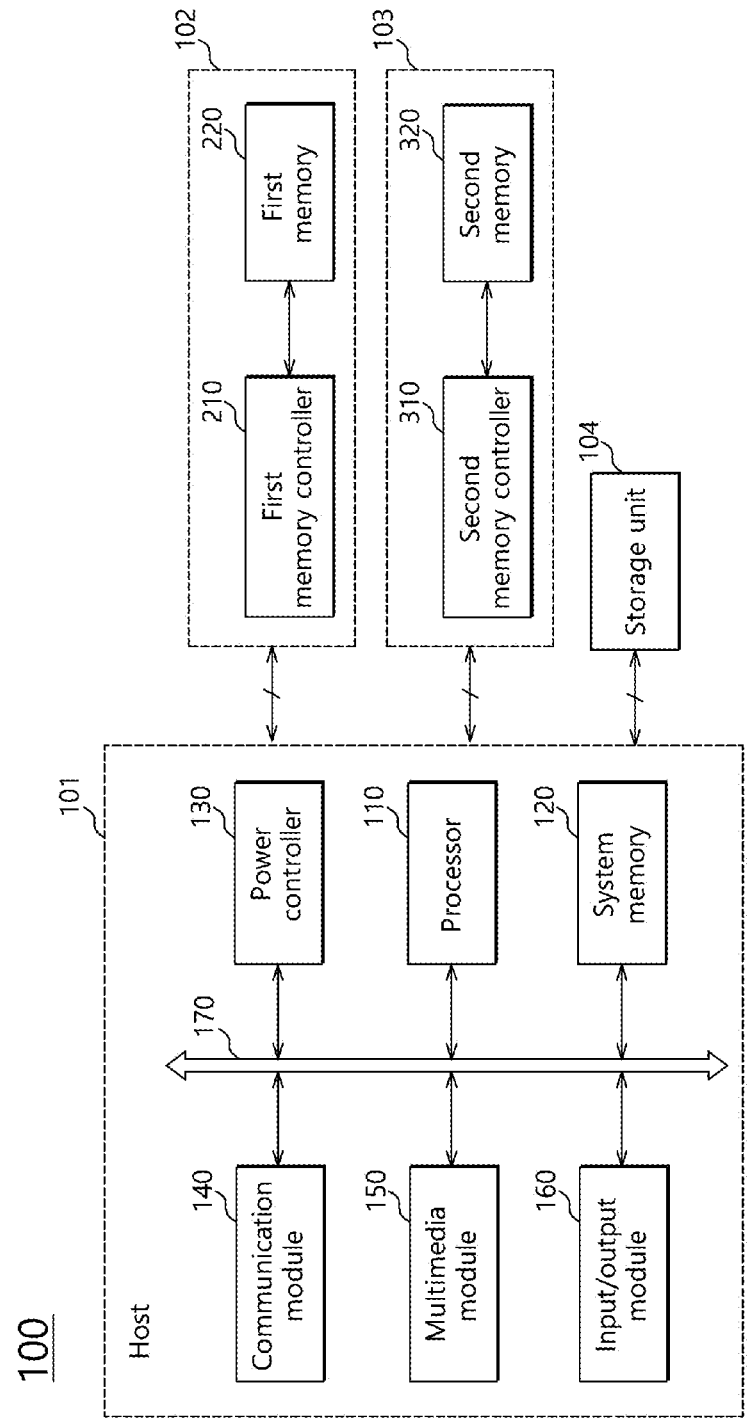
FIG. 1 is a block diagram illustrating a representation of an example of the configuration of an electronic device 100 in accordance with an embodiment.

Referring to FIG. 1, a block diagram illustrating a representation of an example of the configuration of an electronic device 100 in accordance with an embodiment is described.

The electronic device 100 may mean a computing device or system which may execute computer-readable commands. Examples of the electronic device 100 may include workstations, laptops, client-side terminals, servers, distributed computing systems, handheld devices, video game consoles, and the likes.

As illustrated in FIG. 1, the electronic device 100 may include a host 101, a first semiconductor device 102, and a second semiconductor device 103. The host 101 may include modules capable of performing various functions, such as a processor 110, a system memory 120, a power controller 130, a communication module 140, a multimedia module 150 and an input/output module 160. The host 101 may further include a system bus 170 for electrically coupling among the respective modules.

The processor 110 may execute an operating system in the electronic device 100, perform various calculation functions, and control the system memory 120, the power controller 130, the communication module 140, the multimedia module 150 and the input/output module 160 which are included in the host 101, the first semiconductor device 102, the second semiconductor device 103, and a storage unit 104. The processor 110 may include a central processing unit (CPU), a graphic processing unit (GPU), a multimedia processor (MMP) or a digital signal processor (DSP). Furthermore, the processor 110 may be realized in the form of a system-on-chip by combining processor chips having various functions, such as application processors (AP).

The system memory 120 may store information on the operating system. The system memory 120 may also store data processed by the processor 110, and store data generated as a calculation result of the processor 110.

The power controller 130 may adjust a power supply amount so as to supply power appropriate for the processor 110 and respective components in the electronic device 100 to operate and function. The power controller 130 may include a power management IC (PMIC) or the like. The power controller 130 may be supplied with power from outside the electronic device 100 or may be supplied with power from a battery in the electronic device 100.

The communication module 140 may perform signal transmission and reception between the processor 110 and a device outside the electronic device 100 according to various communication protocols. The communication module 140 may include a module capable of being electrically coupled with a wired network and a module capable of being coupled with a wireless network. The wired network module may perform signal transmission and reception in a communication scheme such as LAN (local area network), Ethernet and PLC (power line communication). Further, the wireless network module may perform signal transmission and reception in a communication scheme such as Bluetooth, RFID (radio frequency identification), LTE (long term evolution), Wibro (wireless broadband Internet) and WCDMA (wideband CDMA).

The multimedia module 150 may perform calculation or input/output of multimedia data according to the control of the processor 110. The multimedia module 150 may input/output multimedia data by being electrically coupled to a camera device, an audio device, a 2D or 3D graphic device, a display device or an A/V output device.

The input/output module 160 may receive a signal and output a specific signal to a user through a user interface. The input/output module 160 may receive a signal by being electrically coupled to a keyboard, a keypad, a mouse, a stylus, a microphone, a resistive touch screen device or a capacitive touch screen device, and may output a signal through a speaker, an earphone, a printer or a display device.

The first semiconductor device 102 may store data received from the host 101 or output stored data to the host 101, according to the control of the processor 110 included in the host 101. The first semiconductor device 102 may include at least one first memory controller 210 and at least one first memory 220.

The first memory controller 210 may transmit information or signals such as a clock (CLK), a command/address (CA), a data strobe signal (DQS) and data (DATA) to the first memory 220, as the occasion demands, in order to control data input/output operations of the first memory 220 according to the control of the processor 110 included in the host 101. Such information or signals may be transmitted through the same channels or different channels.

The first memory 220 may input/output data (DATA) in response to the clock (CLK), the command/address (CA) and the data strobe signal (DQS) which are applied from the first memory controller 210. The first memory 220 may be realized by a volatile memory device such as an SRAM (static RAM), a DRAM (dynamic RAM) and an SDRAM (synchronous DRAM).

The second semiconductor device 103 may operate or function as a memory system which is capable of quickly recognizing a control signal received from the host 101 and starting an operation corresponding to the received control signal. The second semiconductor device 103 may include at least one second memory controller 310 and at least one second memory 320.

The second memory controller 310 may be electrically coupled with the second memory 320 through at least one or more channels. The second memory controller 310 may control read, program and erase operations of the second memory 320 according to the control of the processor 110.

The second memory 320 may be electrically coupled with the second memory controller 310 through a plurality of channels. The second memory 320 may include at least one among nonvolatile memory devices such as a ROM (read only memory), a PROM (programmable ROM), an EEPROM (electrically erasable and programmable ROM), an EPROM (electrically programmable ROM), a flash memory, a PRAM (phase change RAM), an MRAM (magnetic RAM), an RRAM (resistive RAM) and an FRAM (ferroelectric RAM). At least one or more nonvolatile memory devices may be electrically coupled to one channel. Nonvolatile memory devices electrically coupled to one channel may be electrically coupled to the same control signal bus and data bus.

The first memory 220 may include a plurality of chips which are stacked in such a way as to be capable of transmitting and receiving signals through thorough vias. The first memory 220 may be configured to set chip IDs of the plurality of respective chips to different values by using chip codes; and cause through via tests for the plurality of stacked chips to be performed, by altering the chip IDs of the plurality of respective chips during a test mode period.

The first memory 220 may be configured to alter the chip IDs of the plurality of respective chips by transmitting external codes through the same transmission paths as the transmission paths of the chip codes during the test mode period.

The first memory 220 may be configured to activate a current source electrically coupled with through vias of a chip of a desired position among the plurality of stacked chips by altering the chip IDs of the plurality of respective chips such that the through via test may be performed.

The first memory controller 210 may be configured to perform the through via test by providing codes calculated differently according to the number of the plurality of chips, to the first memory 220; or by receiving external codes of different values calculated by the host 101 according to the number of the plurality of chips of the first memory 220 and providing the external codes to the first memory 220.

The host 101 may be configured to provide external codes of different values calculated according to the number of the plurality of chips of the first memory 220 to the first memory controller 210, such that the through via test is performed.

The electronic device 100 may include a storage unit (not shown) for storing large data or may use the storage unit 104 outside the electronic device 100. The storage unit 104 may be a large capacity information storage device for storing data and commands for various components of the electronic device 100. The storage unit 104 may be realized by a device such as at least one HDD or flash-based SSD.

The respective components illustrated in FIG. 1 are classified in terms of functions thereof, but do not necessarily mean physical distinguishment. For example, at least two components among components of FIG. 1 may configure a semiconductor system by being formed in one physical semiconductor chip or being included in a single package.

Figure 2:
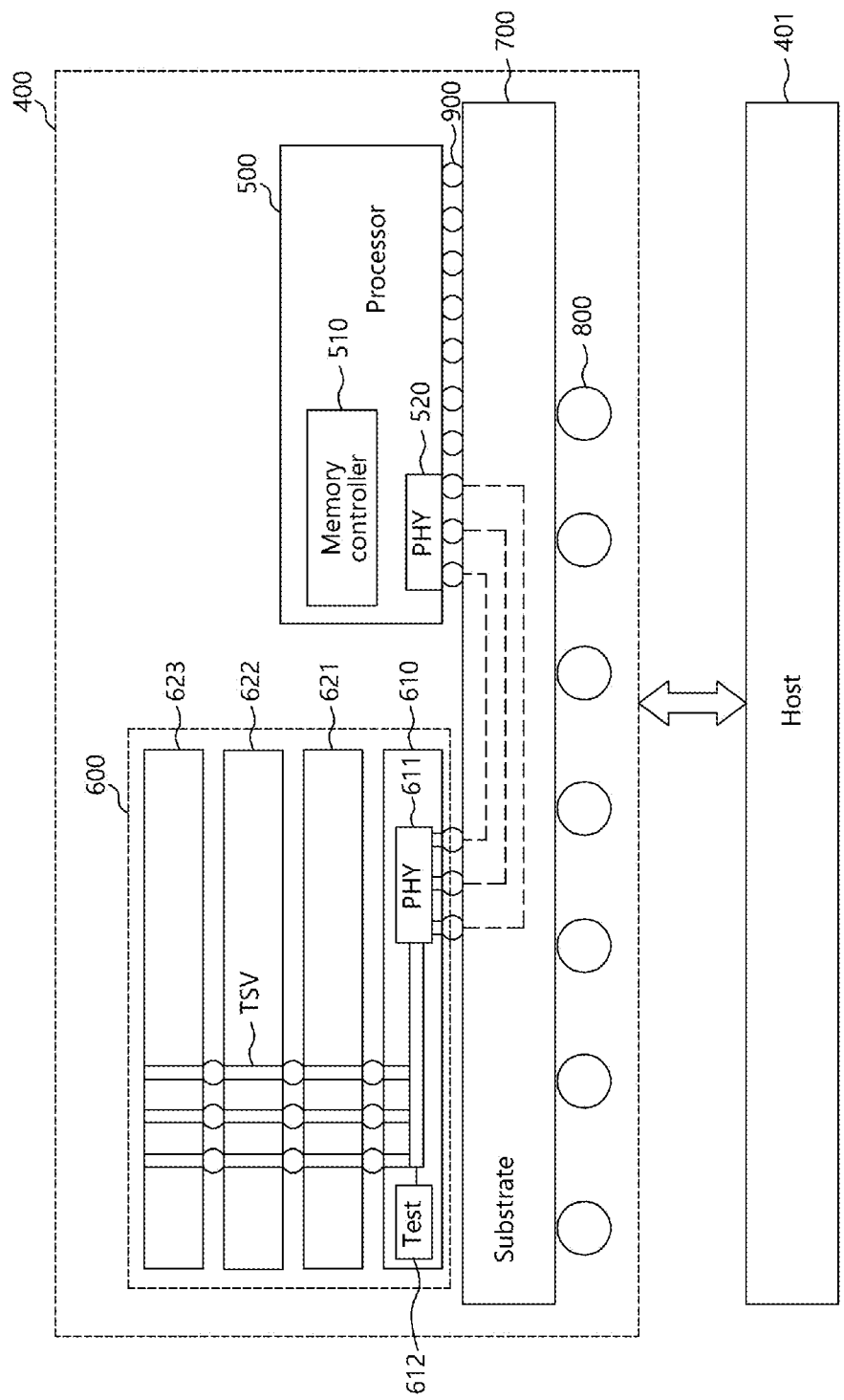
FIG. 2 is a diagram illustrating a representation of an example of a semiconductor system 400 in which at least two components among components of FIG. 1 are formed in one package, in accordance with an embodiment.

Referring to FIG. 2, a configuration diagram illustrating a representation of an example of a semiconductor system 400 in which at least two components among components of FIG. 1 are formed in one package in accordance with an embodiment.

As shown in FIG. 2, the semiconductor system 400 may include a substrate 700, a semiconductor memory 600 and a processor 500. The semiconductor system 400 may be realized in the type of a system-in-package, a multi-chip package or a system-on-chip, and may be realized in the type of a package-on-package which includes a plurality of packages.

The substrate 700 may provide signal paths for smooth data communication between the processor 500 and the semiconductor memory 600. The substrate 700 may also include an additional logic circuit for providing the signal paths and a logic circuit for a test. The substrate 700 may be realized in various types such as of an interposer and a PCB (printed circuit board). The signal paths provided by the substrate 700 may include electrical coupling paths such as metal layers or through-silicon vias.

The substrate 700 may be electrically coupled with an external device through package balls 800 such as a ball grid array, bump balls and C4 bumps. The external device may be a host 401 which operates by being electrically coupled with the semiconductor system 400. The substrate 700 may be electrically coupled with the processor 500 and the semiconductor memory 600 through micro bumps 900.

The processor 500 may communicate with the host 401 through a system bus and the substrate 700. The processor 500 may also perform various calculation operations required by the host 401. The processor 500 may include at least one among a central processing unit (CPU), a graphic processing unit (GPU), a multimedia processor (MMP) and a digital signal processor (DSP). The processor 500 may be realized in the types of a system-on-chip, a system-in-package and a package-on-package in which processor chips having various functions, such as application processors (AP), are combined. In particular, the processor 500 may access the semiconductor memory 600 through a memory controller 510, and a physical layer (PHY) 520 of the memory controller 510 and a physical layer (PHY) 611 of the semiconductor memory 600 may convert signals to be exchanged between them, in conformity with the interface between them. While the present embodiment illustrates an example in which the memory controller 510 is disposed in the processor 500, it is to be noted that, as the case may be, the memory controller 510 may be separately disposed outside the processor 500. In an embodiment, the memory controller 510 may be stacked as any one chip (a base chip or a logic chip) 610 of the semiconductor memory 600. In an embodiment, the memory controller 510 may be separately stacked on the substrate 700 by being separated from the semiconductor memory 600 and the processor 500. The memory controller 510 may provide a command, an address, a clock and data to the semiconductor memory 600 to control the semiconductor memory 600. The memory controller 510 may also receive data outputted from the semiconductor memory 600. The physical layers 520 and 611 may be interface circuits which convert a signal transmitted from the processor 500 or the memory controller 510 into a signal appropriate to be used in the semiconductor memory 600 and output the converted signal or which convert a signal transmitted from the semiconductor memory 600 into a signal appropriate to be used in the processor 500 or the memory controller 510.

The semiconductor memory 600 may be a stacked memory device which includes a plurality of stacked chips. The semiconductor memory 600 may include a logic chip 610 and a plurality of memory chips 621 to 623 which are sequentially stacked on the logic chip 610. The logic chip 610 and the plurality of memory chips 621 to 623 may be electrically coupled through through vias TSV and micro bumps 900. The logic chip 610 may relay signal and data transmission between the memory controller 510 and the plurality of memory chips 621 to 623. The logic chip 610 may include the physical layer 611, a test circuit 612 and a repair-related circuit. The physical layer 611 may receive a signal and data transmitted through the processor 500 or the memory controller 510 and the physical layer 520. The physical layer 611 may amplify signals and data outputted from the plurality of memory chips 621 to 623 and transmit the amplified signals and data to the physical layer 520. The test circuit 612 may perform tests for the plurality of memory chips 621 to 623 by being electrically coupled with the processor 500 or the memory controller 510; or may perform tests for the plurality of memory chips 621 to 623 by being electrically coupled with the host 401, for example, test equipment. In addition, the test circuit 612 may independently perform a test for the semiconductor memory 600. The test circuit 612 may include circuits which may perform tests associated with the plurality of memory chips 621 to 623 and the logic chip 610 at a wafer level and a package level. The test circuit 612 may include various memory test-related circuits such as a built-in self test circuit, a self repair circuit and a self stress circuit. For example, the test circuit 612 may perform a couplability test of through vias or micro bumps, a boundary scan test, a burn-in stress test, a data input/output test, a data compression test, and so on. Further, the test circuit 612 may include a repair logic which replaces a failed memory cell with a redundancy memory cell. The plurality of memory chips 621 to 623 may respectively have data storage spaces for storing data transmitted through the logic chip 610 from the processor 500 or the memory controller 510.

The plurality of memory chips 621 to 623 may further include logic circuits for performing tests in link with the test circuit 612 of the logic chip 610.

In the semiconductor memory 600, any one chip among the plurality of chips 610 and 621 to 623, for example, the logic chip 610 may include a plurality of path circuits for transmitting external data to the other chips 621 to 623 through the through vias TSV. Moreover, any of the remaining chimps among 610 and 621 to 623 excluding the one selecting chip among 610 and 621 to 623 may be configured to write data transmitted through the through vias TSV in memory blocks.

The semiconductor memory 600 may generate a plurality of pre-error detection signals by detecting whether data transmitted between the plurality of path circuits have errors. The semiconductor memory 600 may also selectively output the plurality of pre-error detection signals.

Figure 3:
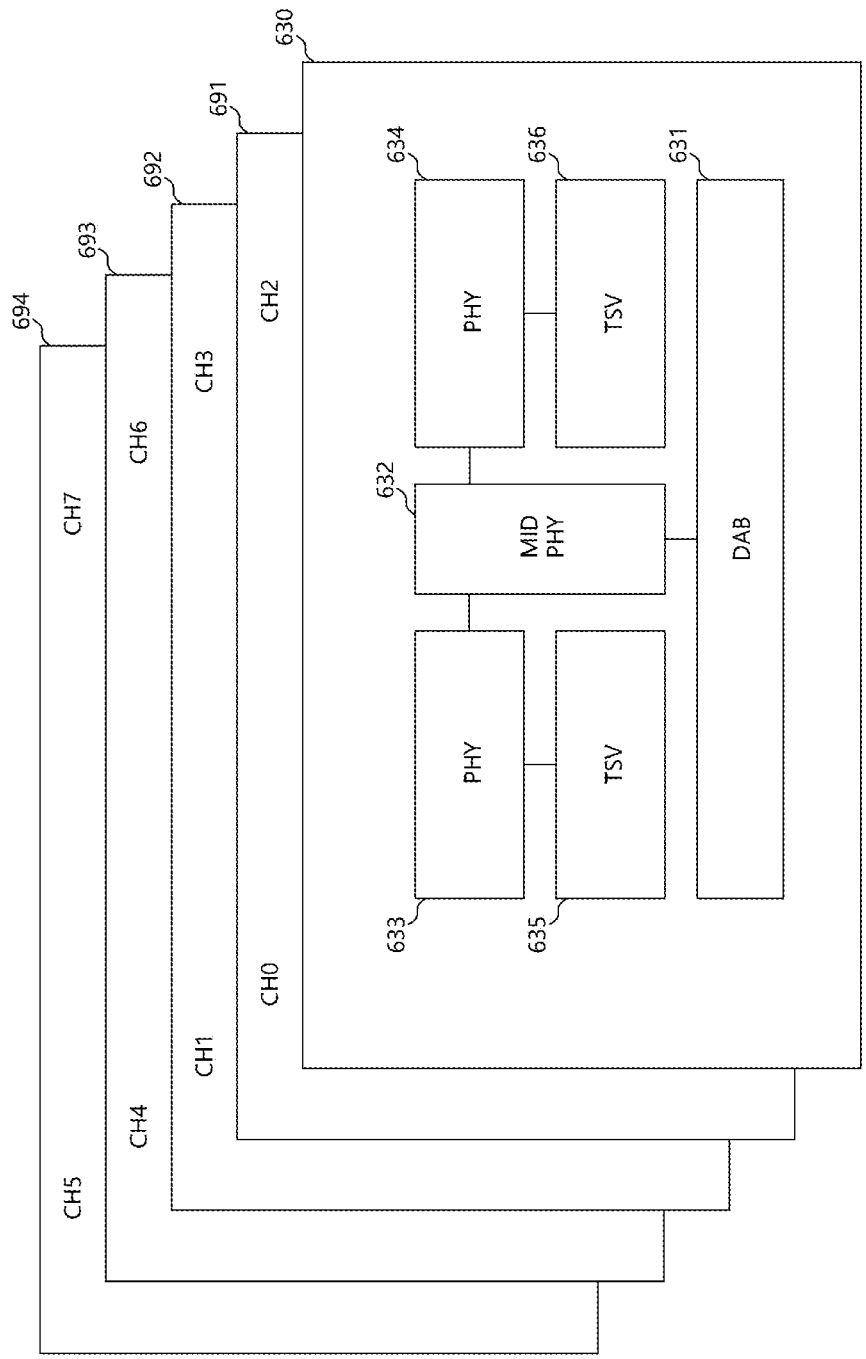
FIG. 3 is a diagram illustrating a representation of an example of the configuration of a semiconductor memory 601 in accordance with an embodiment.

The semiconductor memory 600 of FIG. 2 may be configured like a semiconductor memory 601 of FIG. 3.

Referring to FIG. 3, the semiconductor memory 601 in accordance with an embodiment may include a plurality of stacked chips 630 and 691 to 694. Further, any one chip (for example, the chip 630) may include a plurality of path circuits for transmitting external data to the other chips 691 to 694.

The plurality of chips 630 and 691 to 694 may include a logic chip 630 and a plurality of memory chips 691 to 694.

The plurality of memory chips 691 to 694 may include a plurality of channels CH0 to CH7.

Each of the plurality of memory chips 691 to 694 may include dual channels.

The memory chip 691 may include first and third channels CH0 and CH2. The memory chip 692 may include second and fourth channels CH1 and CH3. The memory chip 693 may include fifth and seventh channels CH4 and CH6. Further, the memory chip 694 may include sixth and eighth channels CH5 and CH7.

The plurality of circuit paths of the logic chip 630 are illustrated as an example which is configured to conform to the dual channel structures of the plurality of memory chips 691 to 694, and may include a direct access electrode region 631, a middle physical layer (MID PHY) 632, first and second physical layers 633 and 634, and first and second through electrode regions 635 and 636.

The direct access electrode region 631 may include electrodes which are exposed to an outside, that is, a plurality of direct access balls DAB, such that direct probing through test equipment is possible even after stacking the logic chip 630 and the plurality of memory chips 691 to 694.

The middle physical layer 632 may perform signal input/output between the direct access electrode region 631 and the first and second physical layers 633 and 634.

The first and second physical layers 633 and 634 may perform signal input/output between the middle physical layer 632 and an external device, for example, the processor 500 (see FIG. 2).

The first and second through electrode regions 635 and 636 may perform signal input/output between the first and second physical layers 633 and 634 and the plurality of memory chips 691 and 694.

If each of the plurality of memory chips 691 to 694 includes only one channel, the middle physical layer (MID PHY) 632, one of the first and second physical layers 633 and 634 and one of the first and second through electrode regions 635 and 636 may be omitted among the plurality of path circuits of the logic chip 630.

The semiconductor memory 601 in accordance with an embodiment may generate a plurality of pre-error detection signals by detecting whether data transmitted between a plurality of path circuits have errors. The semiconductor memory 601 may also selectively output the plurality of pre-error detection signals. This will be described below in detail with reference to FIG. 4.

Figure 4:
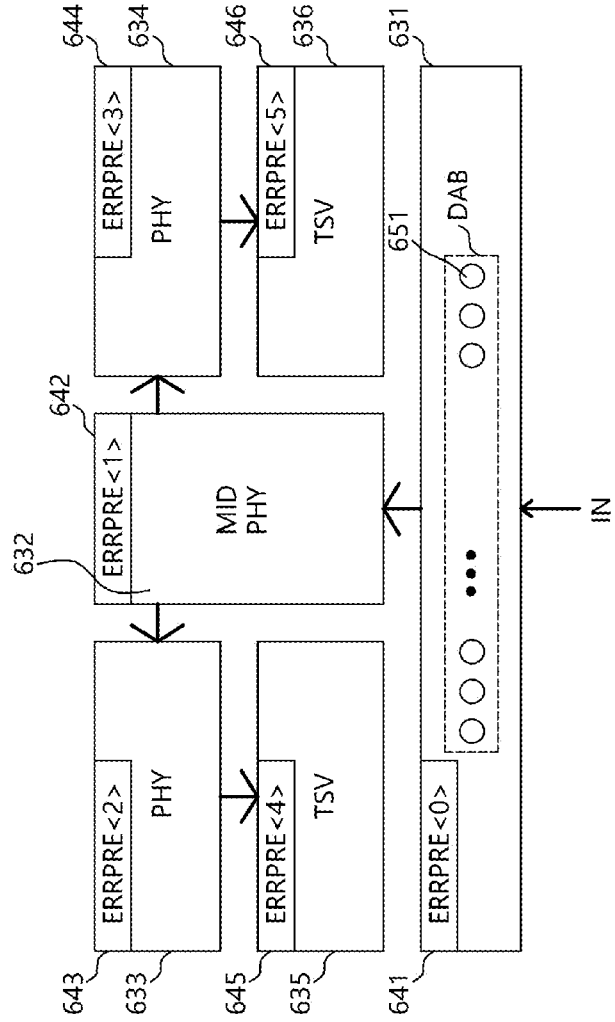
FIG. 4 is a diagram illustrating a representation of an example of the configuration of the semiconductor chip 630 shown in FIG. 3.

Referring to FIG. 4, the logic chip 630 in accordance with an embodiment may include first to sixth error detection circuits 641 to 646 for generating a plurality of pre-error detection signals, that is, first to sixth pre-error detection signals ERRPRE<0:5>, by detecting whether data transmitted among a plurality of path circuits have errors.

One of a plurality of direct access balls DAB of the direct access electrode region 631 may be allocated as an error signal pin 651 for notifying a data error to an exterior.

The first error detection circuit 641 may generate the first pre-error detection signal ERRPRE<0> by detecting an error of data transmitted between the direct access electrode region 631 and the middle physical layer 632.

The second error detection circuit 642 may generate the second pre-error detection signal ERRPRE<1> by detecting an error of data distributed to the first and second physical layers 633 and 634 from the middle physical layer 632.

The third error detection circuit 643 may generate the third pre-error detection signal ERRPRE<2> by detecting an error of data transmitted between the first physical layer 633 and the first through electrode region 635.

The fourth error detection circuit 644 may generate the fourth pre-error detection signal ERRPRE<3> by detecting an error of data transmitted between the second physical layer 634 and the second through electrode region 636.

The fifth error detection circuit 645 may generate the fifth pre-error detection signal ERRPRE<4> by detecting an error of data transmitted between the first through electrode region 635 and a channel of another chip, for example, the first channel CH0 of the memory chip 691.

The sixth error detection circuit 646 may generate the sixth pre-error detection signal ERRPRE<5> by detecting an error of data transmitted between the second through electrode region 636 and the third channel CH2 of the memory chip 691.

The first to sixth pre-error detection signals ERRPRE<0:5> may be selectively outputted to an exterior of the semiconductor memory 601 through the error signal pin 651 of the direct access electrode region 631.

Figure 5:
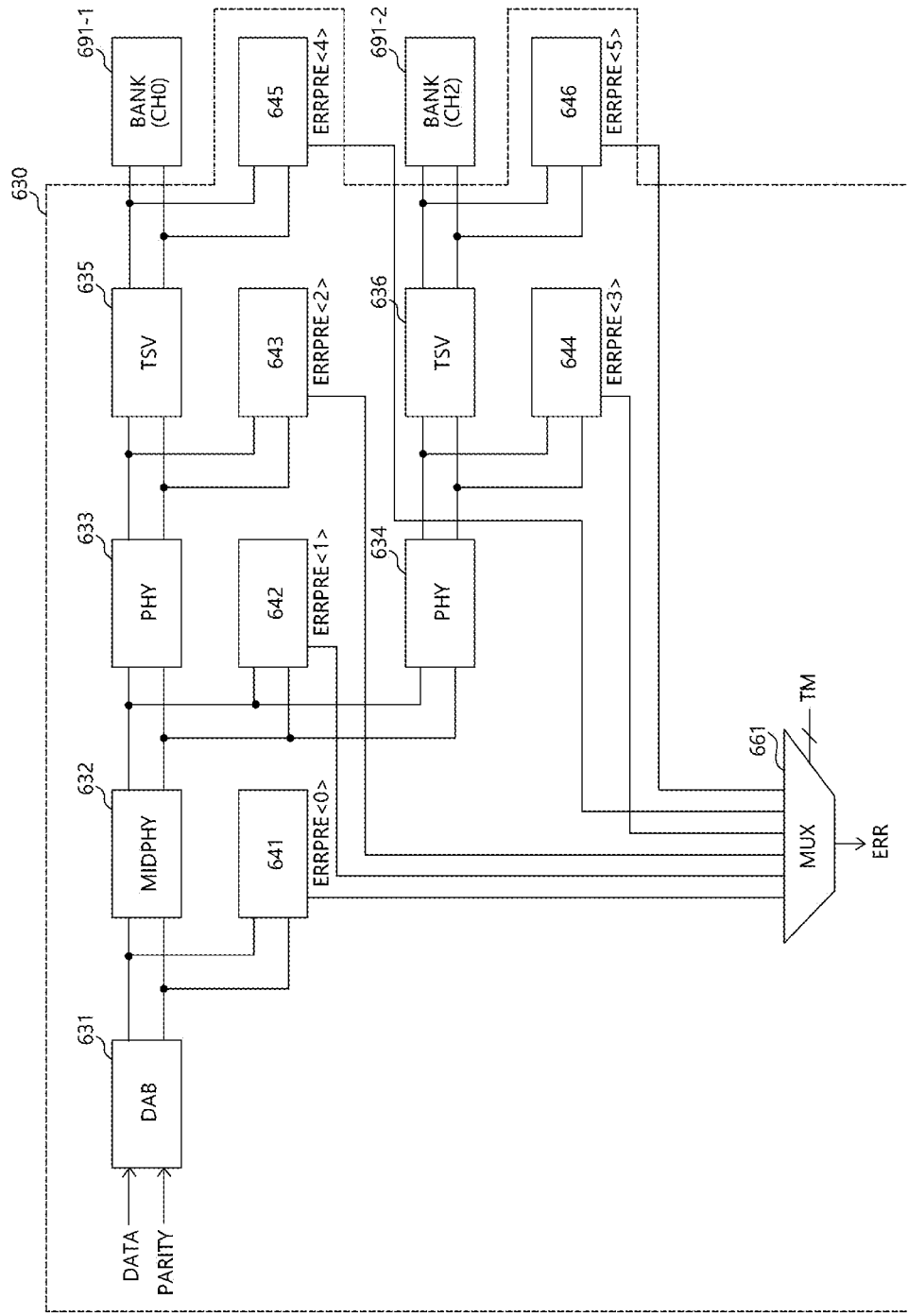
FIG. 5 is a diagram illustrating a representation of an example of the configuration of a circuit for generating an error detection signal ERR in accordance with an embodiment.

A circuit for generating an error detection signal ERR in accordance with an embodiment may be configured as shown in FIG. 5. FIG. 4 also illustrates IN to indicate if an exterior source or the like is in the direction of the direct access electrode region 631.

Referring to FIG. 5, the logic chip 630 in accordance with an embodiment may include a multiplexer (referred to as MUX in FIG. 5) 661 as a circuit component for generating the error detection signal ERR.

An external device, for example, test equipment may provide data DATA and a parity bit PARITY for determining whether the data DATA has an error to the semiconductor memory 601 through the direct access electrode region 631.

The data DATA and the parity bit PARITY may be transmitted to a memory block of the first channel CH0 of the memory chip 691, for example, a memory bank (BANK) 691-1, and a memory block of the third channel CH2 of the memory chip 691, for example, a memory bank (BANK) 691-2, by sequentially passing through the plurality of path circuits, that is, the direct access electrode region 631, the middle physical layer 632, the first and second physical layers 633 and 634 and the first and second through electrode regions 635 and 636.

The first to sixth error detection circuits 641 to 646 may generate the first to sixth pre-error detection signals ERRPRE<0:5> by detecting respective errors of the data DATA between the plurality of path circuits.

The external device outside the semiconductor memory 601 may provide the parity bit PARITY as '0' where the least significant bit of the data DATA is even and provide the parity bit PARITY as '1' where the least significant bit of the data DATA is odd in such a manner that a summed value of the data DATA and the parity bit PARITY becomes even.

Therefore, the first to sixth error detection circuits 641 to 646 may sum the data DATA and the parity bit PARITY between the plurality of path circuits, determine whether corresponding summed values are even, and enable signals corresponding to them among the first to sixth pre-error detection signals ERRPRE<0:5> where the corresponding summed values are odd.

The multiplexer 661 may output the error detection signal ERR by selecting one among the first to sixth pre-error detection signals ERRPRE<0:5> according to a control signal, for example, a test mode signal TM.

The error detection signal ERR may be provided to an exterior of the semiconductor memory 601, for example, the test equipment, through the error signal pin 651 of the direct access electrode region 631, as described above with reference to FIG. 4.

A signal desired among the first to sixth pre-error detection signals ERRPRE<0:5> may be selected according to the test mode signal TM.

As described above, in an embodiment of the invention, since a signal desired among the first to sixth pre-error detection signals ERRPRE<0:5> may be selected, it is possible to monitor an error of data and a precise position where the data error has occurred.

While various embodiments have been described above, it will be understood to those skilled in the art that the embodiments described are examples only. Accordingly, the semiconductor memory and the semiconductor system using the same described herein should not be limited based on the described embodiments.

What is claimed is:

1. A semiconductor memory comprising:
    a plurality of path circuits for transmitting an external data inputted from an exterior source or device to a chip,
    wherein the semiconductor memory is configured to generate a plurality of pre-error detection signals by detecting whether data transmitted between the plurality of path circuits have errors, and selectively output the plurality of pre-error detection signals.

2. The semiconductor memory according to claim 1, wherein the plurality of path circuits comprise:
    a physical layer; and
    a through electrode region for transmitting data transmitted through the physical layer to another chip.

3. The semiconductor memory according to claim 2, wherein the plurality of path circuits further comprise:
    a direct access electrode region for transmitting the data inputted from the exterior source or device to the physical layer.

4. The semiconductor memory according to claim 1, wherein the semiconductor memory is configured to generate the plurality of pre-error detection signals by using data transmitted between the plurality of path circuits and a parity bit provided from the exterior source or device.

5. The semiconductor memory according to claim 1, wherein the semiconductor memory comprises:
    a plurality of error detection circuits configured to generate the plurality of pre-error detection signals according to the data transmitted between the plurality of path circuits and a parity bit; and
    a multiplexer configured to output an error detection signal by selecting one among the plurality of pre-error detection signals according to a control signal.

6. The semiconductor memory according to claim 1, wherein the semiconductor memory is configured to output one selected among the plurality of pre-error detection signals through an error signal pin to an exterior portion of the semiconductor memory.

7. A semiconductor memory comprising:
    a plurality of chips stacked such that signals are transmitted and received through through electrodes,
    wherein any one of the plurality of chips comprises a plurality of path circuits for transmitting external data to the other chips through the through electrodes, and
    wherein the semiconductor memory is configured to generate a plurality of pre-error detection signals by detecting whether data transmitted between the plurality of path circuits have errors, and selectively output the plurality of pre-error detection signals.

8. The semiconductor memory according to claim 7, wherein remaining chips excluding the any one chip among the plurality of chips are configured to write data transmitted through the through electrodes.

9. The semiconductor memory according to claim 7, wherein the plurality of path circuits comprise:
    a direct access electrode region for receiving the external data; and
    a physical layer for transmitting data transmitted through the direct access electrode region to the through electrodes.

10. The semiconductor memory according to claim 7, wherein the semiconductor memory is configured to generate the plurality of pre-error detection signals by using data transmitted between the plurality of path circuits and a parity bit provided from an exterior source or device.

11. The semiconductor memory according to claim 7, wherein the semiconductor memory comprises:
    a plurality of error detection circuits configured to generate the plurality of pre-error detection signals according to the data transmitted between the plurality of path circuits and a parity bit; and
    a multiplexer configured to output an error detection signal by selecting one among the plurality of pre-error detection signals according to a control signal.

12. The semiconductor memory according to claim 7, wherein the semiconductor memory is configured to output one selected among the plurality of pre-error detection signals, through an error signal pin included in a direct access through region, to an exterior portion of the semiconductor memory.

13. A semiconductor memory comprising:
    a physical layer and a through electrode coupled such that external data and a parity bit corresponding to the external data sequentially pass therethrough;
    a first error detection circuit configured to detect a first pre-error detection signal by using the external data and the parity bit;
    a second error detection circuit configured to detect a second pre-error detection signal by using the external data and the parity bit passing through the through electrode and a memory block; and
    a multiplexer configured to output an error detection signal by selecting one of the first pre-error detection signal and the second pre-error detection signal according to a control signal.

14. The semiconductor memory according to claim 13, further comprising:
    a direct access electrode region for transmitting the external data and the parity bit corresponding to the external data, to the physical layer; and
    a third error detection circuit configured to detect a third pre-error detection signal by using the external data and the parity bit passing through the direct access electrode region and the physical layer.

15. The semiconductor memory according to claim 1, wherein the semiconductor memory is configured to output an error detection signal generated by detecting whether the data transmitted between the plurality of path circuits for any one chip among a plurality of chips to transmit the external data to the other chips through through electrodes has an error.

16. The semiconductor memory according to claim 15, further comprises:

a processor configured to provide the external data to the semiconductor memory, and determine whether a data transmission error has occurred according to the error detection signal; and a substrate configured to provide signal paths for communication between the processor and the semiconductor memory.

17. The semiconductor memory according to claim 16, wherein the plurality of path circuits comprise:
    a physical layer for receiving the external data from the processor; and
    a through electrode region for transmitting data transmitted through the physical layer to remaining chips excluding the any one chip.

18. The semiconductor memory according to claim 16, wherein the semiconductor memory is configured to output the error detection signal through an error signal pin coupled with a physical layer to the processor.

19. The semiconductor memory according to claim 15, wherein the semiconductor memory comprises:
    a physical layer and a through electrode coupled such that the external data and a parity bit corresponding to the external data sequentially pass therethrough;
    a first error detection circuit configured to detect a first pre-error detection signal by using the external data and the parity bit corresponding to the external data passing through the physical layer and the through electrode;
    a second error detection circuit configured to detect a second pre-error detection signal by using the external data and the parity bit corresponding to the external data passing through the through electrode and another chip; and
    a multiplexer configured to output the error detection signal by selecting one of the first pre-error detection signal and the second pre-error detection signal according to a control signal.

20. The semiconductor memory according to claim 19, wherein further comprising:
    a direct access electrode region for transmitting the external data and the parity bit corresponding to the external data to the physical layer; and
    a third error detection circuit configured to detect a third pre-error detection signal by using the external data and the parity bit corresponding to the external data passing through the direct access electrode region and the physical layer.

* * * * *

UNITED STATES PATENT AND TRADEMARK OFFICE
CERTIFICATE OF CORRECTION

Page 1 of 1

PATENT NO.         : 9,804,914 B2
APPLICATION NO.    : 15/048200
DATED              : October 31, 2017
INVENTOR(S)        : Min Jeong Kim It is certified that error appears in the above-identified patent and that said Letters Patent is hereby corrected as shown below:

On the Title Page

Item (71) Applicant:
Replace "SK hynix Inc., Incheon-si, Gyeonggi-do (KR)" with --SK hynix Inc., Icheon-si, Gyeonggi-do (KR)--

Item (72) Inventor:
Replace "Min Jeong Kim, Icheon-si (KR)" with --Min Jeong Kim, Icheon-si, Gyeonggi-do (KR)--

Signed and Sealed this
Twenty-fourth Day of April, 2018

Andrei Iancu
*Director of the United States Patent and Trademark Office*